US012700719B2

(12) United States Patent (10) Patent No.: US 12,700,719 B2
Lu et al. (45) Date of Patent: Aug. 4, 2026

(54) BUS BAR ASSEMBLY AND SERVER DEVICE

(71) Applicants: SQ TECHNOLOGY(SHANGHAI) CORPORATION, Shanghai (CN); INVENTEC CORPORATION, Taipei City (TW)

(72) Inventors: Xiaogang Lu, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 101 days.

(21) Appl. No.: 18/743,757

(22) Filed: Jun. 14, 2024

(65) Prior Publication Data

US 2025/0357733 A1    Nov. 20, 2025

(30) Foreign Application Priority Data

May 15, 2024    (CN) .......................... 202410607241.6

(51) Int. Cl.
 *H05K 7/14*         (2006.01)
 *H02B 1/21*         (2006.01)
(52) U.S. Cl.
 CPC ............. *H02B 1/21* (2013.01); *H05K 7/1492* (2013.01)

(58) Field of Classification Search
 CPC ...... H02B 1/21; H05K 7/1492; G06F 13/409; G06F 1/20
 See application file for complete search history.

(56) References Cited

U.S. PATENT DOCUMENTS 9,006,571 B2 *  4/2015  Manhart .................. H02G 5/02
                                                174/88 B
2015/0035496 A1 *  2/2015  Kikuchi ............. H05K 7/14329
                                                174/68.2

* cited by examiner

*Primary Examiner* — Imani N Hayman
*Assistant Examiner* — Hung Q Dang
(74) *Attorney, Agent, or Firm* — Maschoff Brennan

(57)          ABSTRACT

A bus bar assembly includes a vertical bus bar and a transverse bus bar. The vertical bus bar includes a first positive plate, a first negative plate and a first insulation plate. At least a part of the first insulation plate is disposed between the first positive plate and the first negative plate. The transverse bus bar is connected to the vertical bus bar, and includes a second positive plate, a second negative plate and a second insulation plate. At least a part of the second insulation plate is disposed between the second positive plate and the second negative plate. The first positive plate and the first negative plate are perpendicular to the second positive plate and the second negative plate, respectively.

7 Claims, 10 Drawing Sheets

10B

BUS BAR ASSEMBLY AND SERVER DEVICE

CROSS-REFERENCE TO RELATED APPLICATIONS

This non-provisional application claims priority under 35 U.S.C. § 119(a) on Patent Application No(s). 202410607241.6 filed in China, on May 15, 2024, the entire contents of which are hereby incorporated by reference.

BACKGROUND OF THE INVENTION

Technical Field of the Invention

The invention relates to a bus bar assembly and a server device, more particularly to a bus bar assembly and a server device including a plurality of bus bars perpendicular to each other.

Description of the Related Art

Nowadays, with the rapid development of the information technology, most of enterprises may do various tasks on the business via a server, such as storing data. Accordingly, the efficiency of doing tasks on the business can be improved. Generally, the higher the performance of the server is, the more the heat is generated by the server. Thus, such server having high performance is required to be cooled via a high-efficiency cooling system, such as an immersion cooling system. Since the immersion cooling system cools the server via a vertical convection of a liquid coolant, it is usually be used to cool a blade server. However, the blade server is vertically disposed in a server cabinet. That is, a mounting direction of the blade server is different from a mounting direction of a power supply disposed in the server cabinet. In the server cabinet, the power supply supplies power to the server via a bus bar. The server and the power supply with different mounting directions may cause the inconvenience for installing the bus bar. Therefore, improving the convenience for configuring components in the server cabinet is one of the problems required to be addressed.

SUMMARY OF THE INVENTION

The invention provides a bus bar assembly and a server device so as to improve the convenience for configuring components in the cabinet.

One embodiment of the invention provides a bus bar assembly configured to be mounted in a cabinet and electrically connecting a power supply and at least one server. The bus bar assembly includes a vertical bus bar, a transverse bus bar and two conductive connecting plates. The vertical bus bar includes a first positive plate, a first negative plate and a first insulation plate. At least a part of the first insulation plate is disposed between the first positive plate and the first negative plate. The first positive plate and the first negative plate are configured to be electrically connected to the power supply. The transverse bus bar is connected to the vertical bus bar, and includes a second positive plate, a second negative plate and a second insulation plate. At least a part of the second insulation plate is disposed between the second positive plate and the second negative plate. The second positive plate and the second negative plate are configured to be electrically connected to the at least one server. One of the two conductive connecting plates is electrically connected to the first positive plate and the second positive plate. Another one of the two conductive connecting plates is electrically connected to the first negative plate and the second negative plate. The first positive plate and the first negative plate are perpendicular to the second positive plate and the second negative plate, respectively.

Another embodiment of the invention provides a service device including a cabinet, a power supply, at least one server and a bus bar assembly. The power supply is disposed in the cabinet. The at least one server is disposed in the cabinet. The bus bar assembly is disposed in the cabinet. The bus bar assembly includes a vertical bus bar, a transverse bus bar and two conductive connecting plates. The vertical bus bar includes a first positive plate, a first negative plate and a first insulation plate. At least a part of the first insulation plate is disposed between the first positive plate and the first negative plate. The first positive plate and the first negative plate are electrically connected to the power supply. The transverse bus bar is connected to the vertical bus bar, and includes a second positive plate, a second negative plate and a second insulation plate. At least a part of the second insulation plate is disposed between the second positive plate and the second negative plate. The second positive plate and the second negative plate are electrically connected to the at least one server. One of the two conductive connecting plates is electrically connected to the first positive plate and the second positive plate. Another one of the two conductive connecting plates is electrically connected to the first negative plate and the second negative plate. The first positive plate and the first negative plate are perpendicular to the second positive plate and the second negative plate, respectively.

According to the bus bar assembly and the server device disclosed by the above embodiments, the first positive plate and the first negative plate of the vertical bus bar are perpendicular to the second positive plate and the second negative plate of the transverse bus bar, respectively. That is, since the bus bar assembly has the vertical bus bar and the transverse bus bar, a supplying direction of the power is allowed to be transferred from a vertical direction to a transverse direction. Thus, the bus bar assembly allows the power supply and the server perpendicular to each other to be electrically connected to each other without additional mounting components, thereby improving the convenience for configuring the components in the cabinet.

BRIEF DESCRIPTION OF THE DRAWINGS

The invention will become more fully understood from the detailed description given herein below and the accompanying drawings which are given by way of illustration only and thus are not limitative of the invention and wherein.

DETAILED DESCRIPTION

Figure 1:
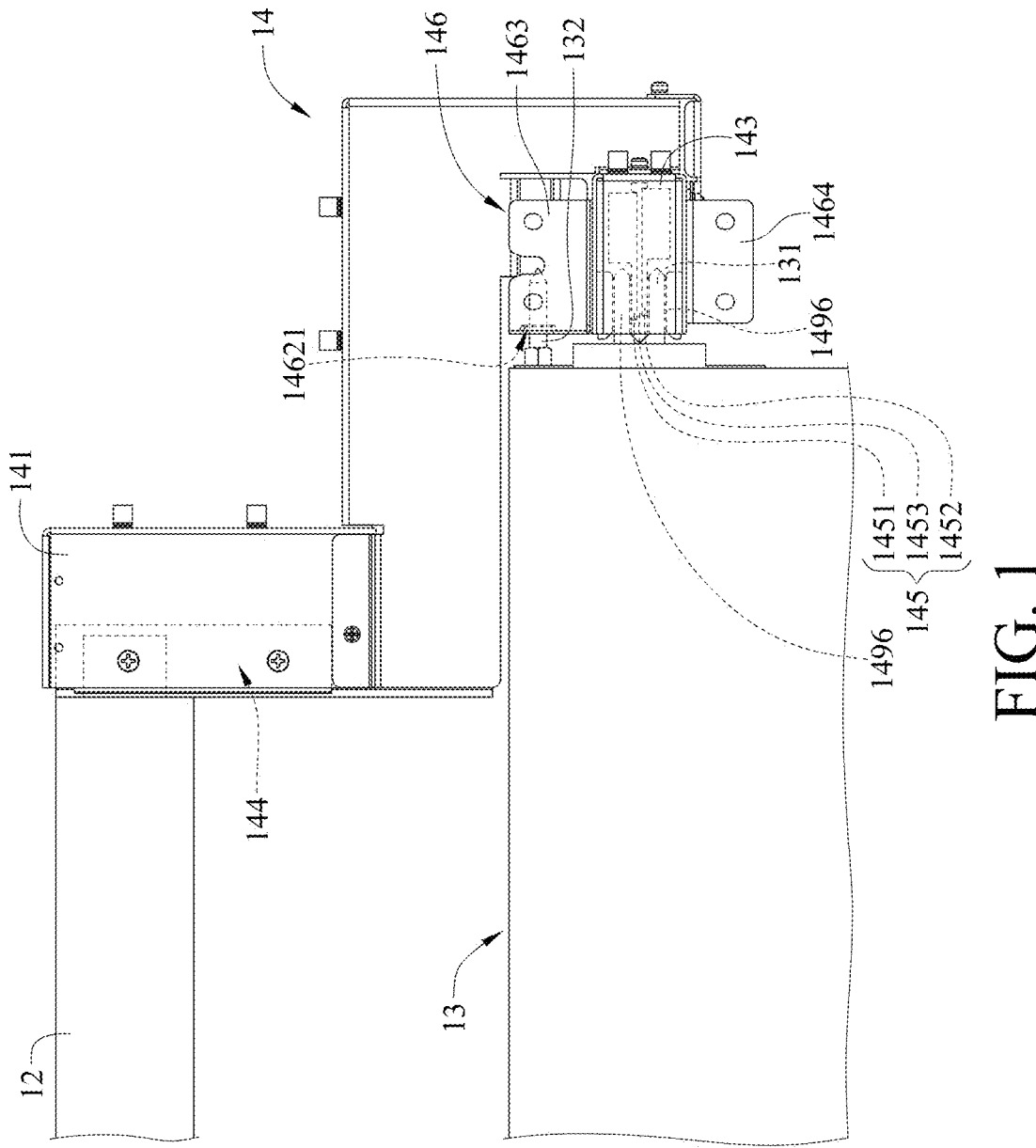
FIG. 1 is a plane view of a server device in accordance with a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the invention, such as technical and scientific terms, have its own meanings and can be comprehended by those skilled in the art, unless the terms are additionally defined in the invention. That is, the terms used in the following paragraphs should be read on the meaning commonly used in the related fields and will not be overly explained, unless the terms have a specific meaning in the invention.

Figure 2:
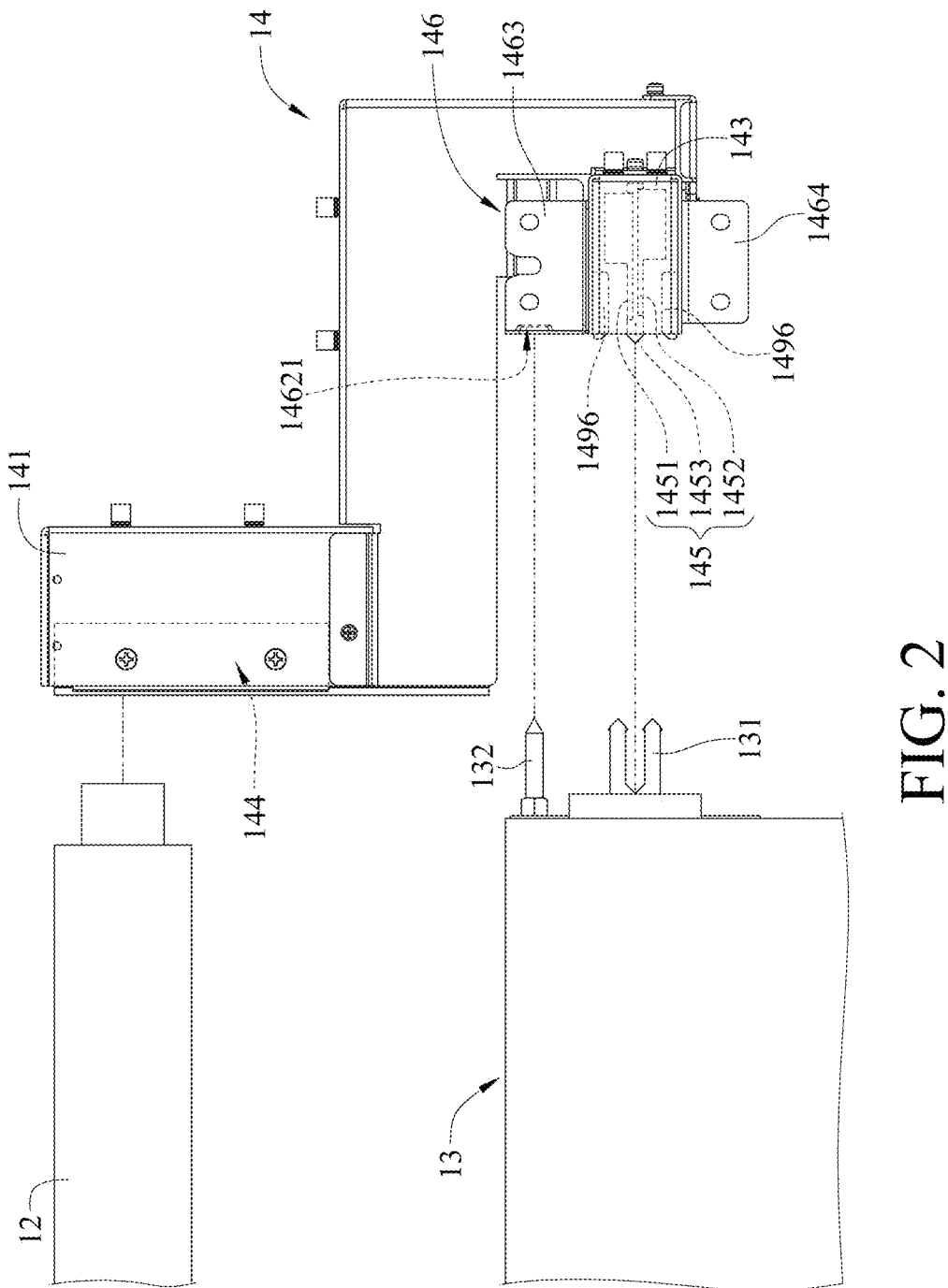
FIG. 2 is an exploded plane view of the server device in FIG. 1.
Figure 3:
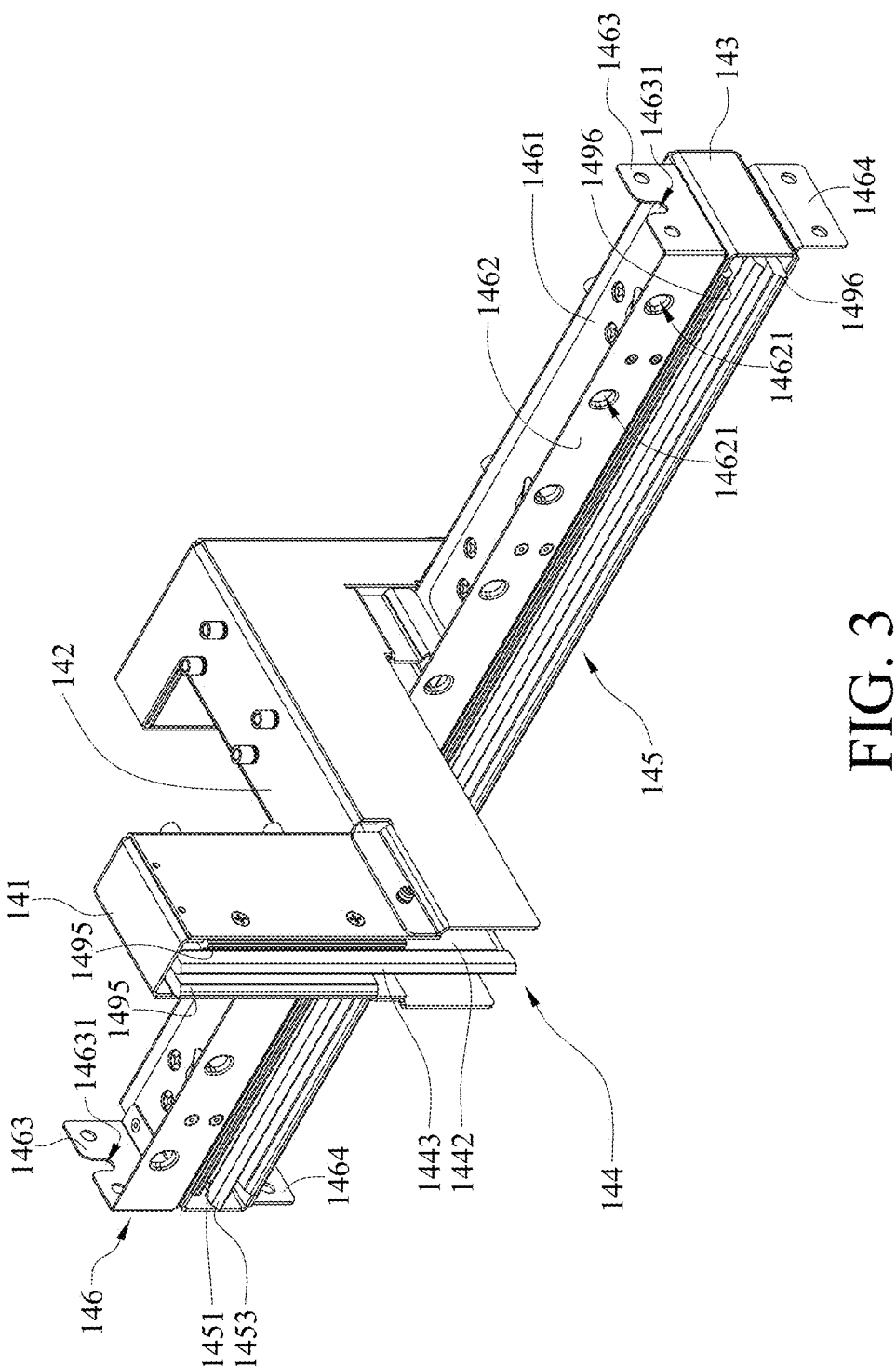
FIG. 3 is a perspective view of a bus bar assembly of the server device in FIG. 1.
Figure 4:
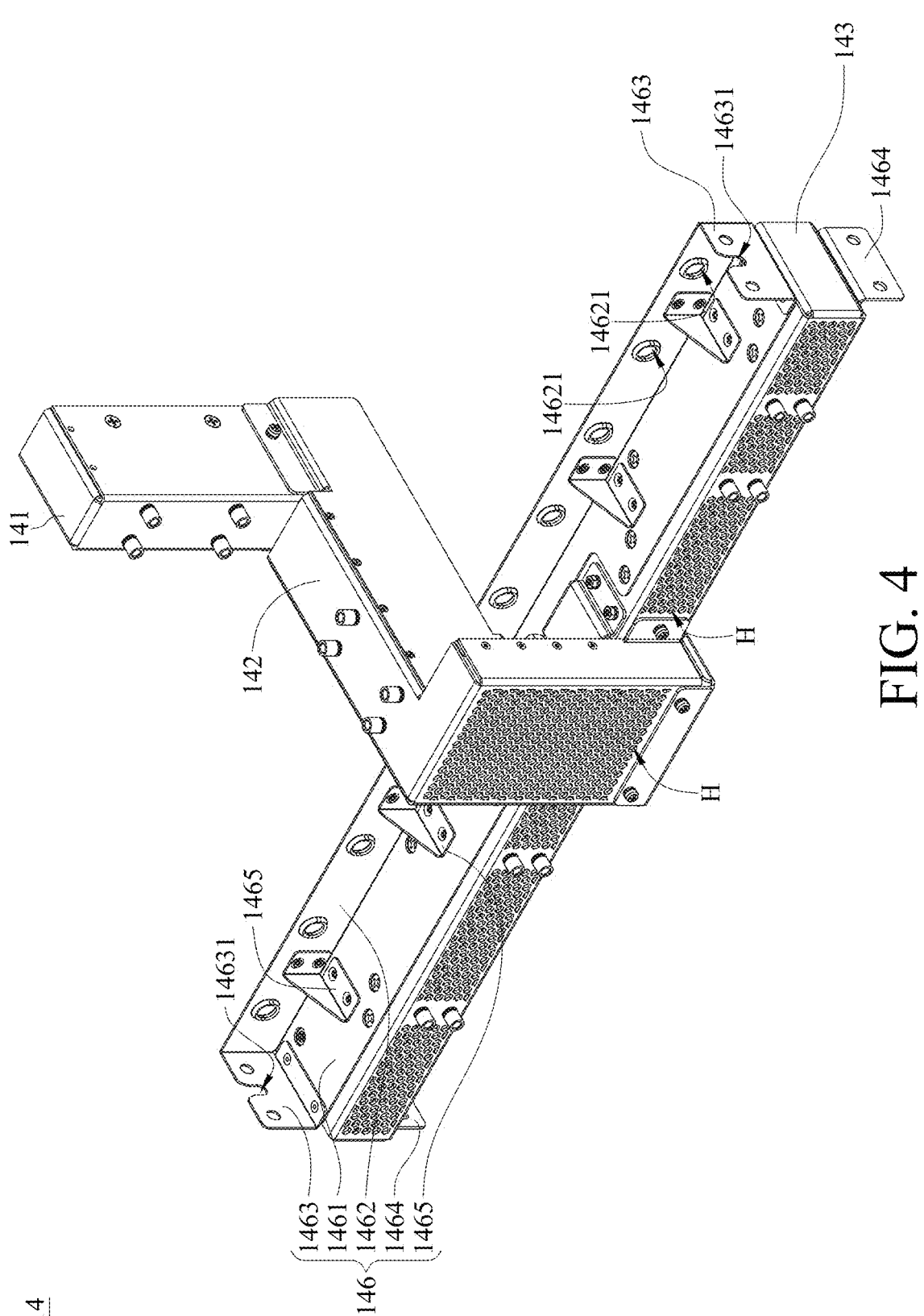
FIG. 4 is another perspective view of the bus bar assembly of the server device in FIG. 1.
Figure 5:
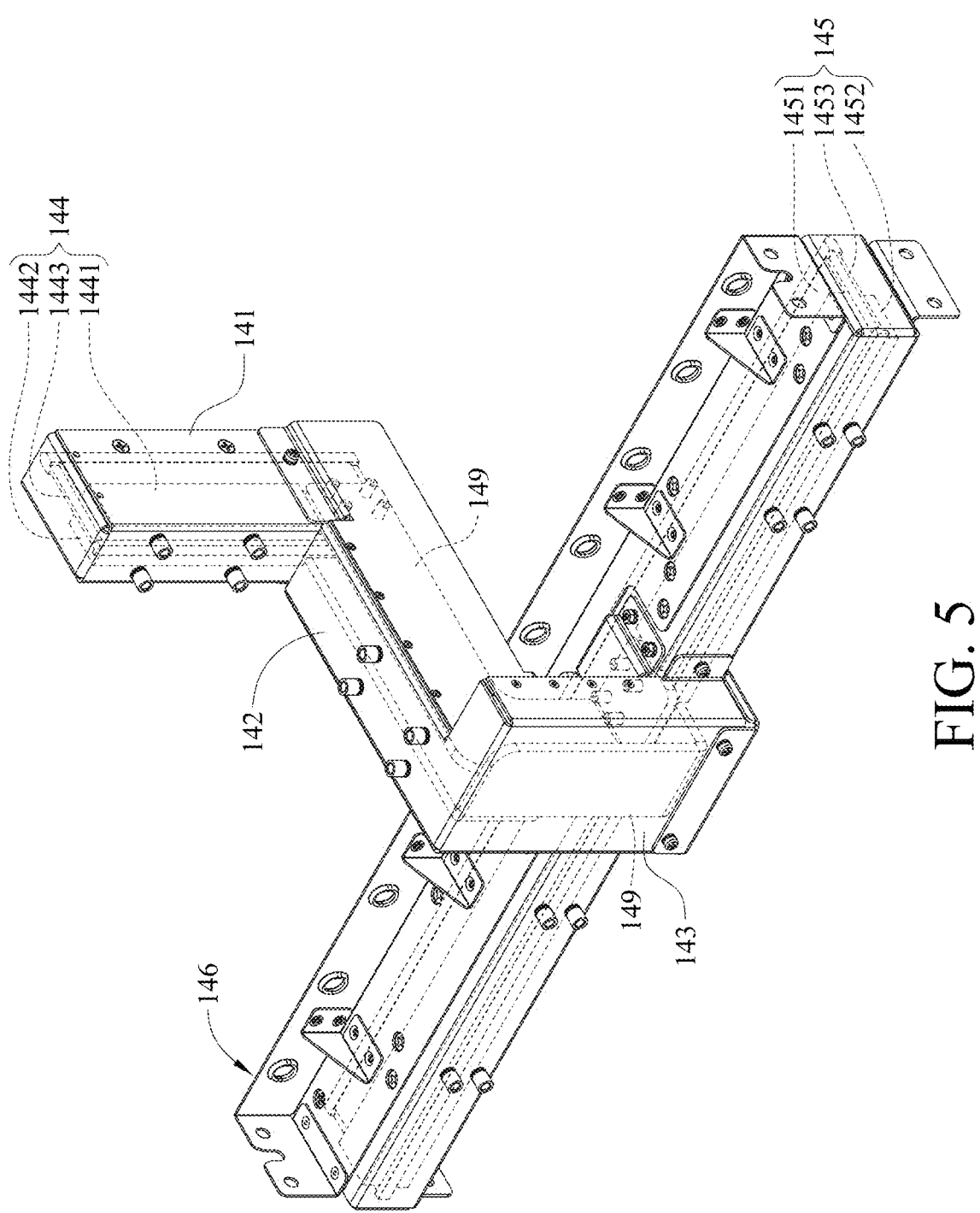
FIG. 5 is still another perspective view of the bus bar assembly of the server device in FIG. 1.
Figure 6:
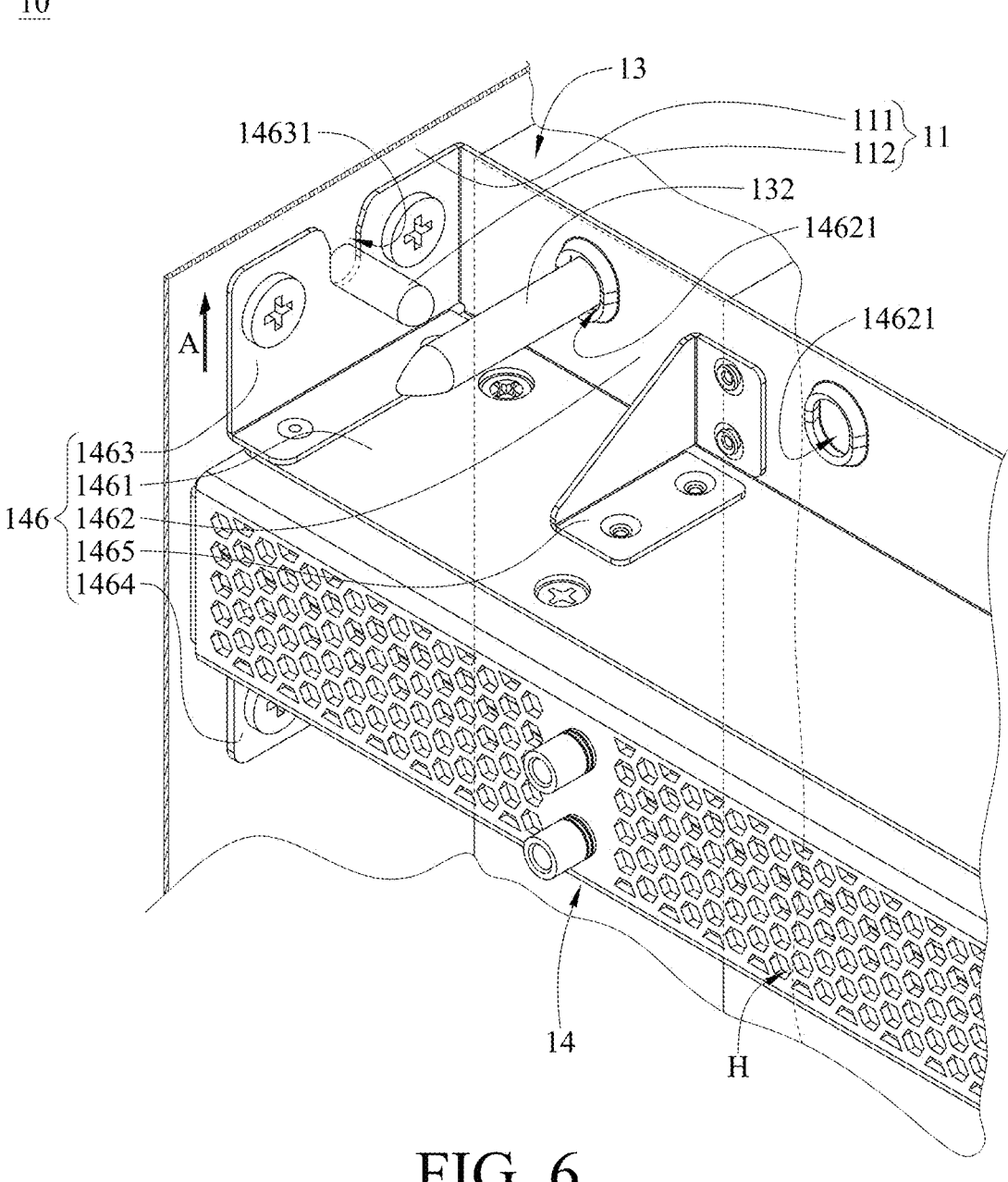
FIG. 6 is an enlarged perspective view of the server device in FIG. 1.

Please refer to FIG. 1 to FIG. 6, where FIG. 1 is a plane view of a server device 10 in accordance with a first embodiment of the invention, FIG. 2 is an exploded plane view of the server device 10 in FIG. 1, FIG. 3 is a perspective view of a bus bar assembly 14 of the server device 10 in FIG. 1, FIG. 4 is another perspective view of the bus bar assembly 14 of the server device 10 in FIG. 1, FIG. 5 is still another perspective view of the bus bar assembly 14 of the server device 10 in FIG. 1, and FIG. 6 is an enlarged perspective view of the server device 10 in FIG. 1.

In this embodiment, the server device 10 includes a cabinet 11, a power supply 12, a server 13 and a bus bar assembly 14. The power supply 12, the server 13 and the bus bar assembly 14 are disposed in the cabinet 11. A mounting direction of the power supply 12 is, for example, perpendicular to a mounting direction of the server 13. In detail, the power supply 12 is, for example, transversely disposed in the cabinet 11, and the server 13 is, for example, vertically disposed in the cabinet 11. The power supply 12 and the server 13 have, for example, different heights. For example, the power supply 12 is located at a higher position in the cabinet 11 than the server 13. That is, the server 13 is located on a bottom side of the power supply 12. The server 13 is, for example, a blade server, and is configured to be cooled by an immersion cooling system (not shown). Since the immersion cooling system cools the server 13 via a vertical convection of a liquid coolant, a cooling efficiency of the immersion cooling system cooling the server 13 can be improved via the server 13 vertically disposed in the cabinet 11.

The bus bar assembly 14 is disposed in the cabinet 11, and is located on a side of the power supply 12 and the server 13. The bus bar assembly 14 includes a first casing 141, a connecting casing 142, a second casing 143, a vertical bus bar 144, a transverse bus bar 145 and two conductive connecting plates 149. The first casing 141 accommodates the vertical bus bar 144. The second casing 143 accommodates the transverse bus bar 145. The connecting casing 142 connects the first casing 141 and the second casing 143, and accommodates the two conductive connecting plates 149.

The vertical bus bar 144 includes a first positive plate 1441, a first negative plate 1442 and a first insulation plate 1443. At least a part of the first insulation plate 1443 is disposed between the first positive plate 1441 and the first negative plate 1442. The first positive plate 1441 and the first negative plate 1442 are electrically connected to the power supply 12. The transverse bus bar 145 is connected to the vertical bus bar 144, and includes a second positive plate 1451, a second negative plate 1452 and a second insulation plate 1453. At least a part of the second insulation plate 1453 is disposed between the second positive plate 1451 and the second negative plate 1452. One of the two conductive connecting plates 149 is electrically connected to the first positive plate 1441 and the second positive plate 1451, and the other conductive connecting plate 149 is electrically connected to the first negative plate 1442 and the second negative plate 1452. The server 13 includes an electrical connector 131. The second positive plate 1451 and the second negative plate 1452 are electrically connected to the electrical connector 131. The first positive plate 1441 and the first negative plate 1442 are, for example, perpendicular to the second positive plate 1451 and the second negative plate 1452, respectively. Accordingly, the power supply 12 can supply power to the servers 13 via the vertical bus bar 144 and the transverse bus bar 145. That is, since the bus bar assembly 14 has the vertical bus bar 144 and the transverse bus bar 145, a supplying direction of the power is allowed to be transferred from a vertical direction to a transverse direction.

In this embodiment, the first positive plate 1441 and the first negative plate 1442 of the vertical bus bar 144 are perpendicular to the second positive plate 1451 and the second negative plate 1452 of the transverse bus bar 145, respectively. That is, since the bus bar assembly 14 has the vertical bus bar 144 and the transverse bus bar 145, a supplying direction of the power is allowed to be transferred from a vertical direction to a transverse direction. Thus, the bus bar assembly 14 allows the power supply 12 and the server 13 perpendicular to each other to be electrically connected to each other without additional mounting components, thereby improving the convenience for configuring the components in the cabinet 11.

In this embodiment, the bus bar assembly 14 may further include an assembling bracket 146. The assembling bracket 146 includes a bottom plate 1461, a connecting plate 1462, two upper side plates 1463, two lower side plates 1464 and a plurality of connecting members 1465. The bottom plate 1461 is disposed on the second casing 143. The connecting plate 1462 is vertically connected to the bottom plate 1461 via the connecting members 1465. Accordingly, a structure of the connection between the connecting plate 1462 and the bottom plate 1461 can be strengthened via the connecting members 1465. The two upper side plates 1463 are vertically connected to opposite sides of the bottom plate 1461 and the connecting plate 1462. The two lower side plates 1464 are vertically connected to a side of the second casing 143 away from the two upper side plates 1463. The two upper side plates 1463 and the two lower side plates 1464 are fixed to the cabinet 11.

In detail, the cabinet 11 includes a casing body 111 and two limiting protrusions 112. The power supply 12, the server 13, the bus bar assembly 14 and the two limiting protrusions 112 are disposed on the casing body 111. The two upper side plates 1463 and the two lower side plates 1464 are fixed to the casing body 111. Each of the two upper side plates 1463 has a limiting recess 14631. The server 13 includes a positioning protrusion 132. The connecting plate 1462 has a plurality of positioning holes 14621. The positioning holes 14621 are arranged along an extending direction of the connecting plate 1462. That is, the positioning holes 14621 are arranged transversely. The assembling bracket 146 is configured to be moved along a direction A, such that the two limiting protrusions 112 are disposed into the limiting recesses 14631, respectively, and the positioning protrusion 132 is optionally inserted into one of the positioning holes 14621 so as to position the cabinet 11, the bus bar assembly 14 and the server 13.

In this embodiment, a side of the connecting casing 142 away from the first casing 141 and a side of the second casing 143 away from the first casing 141 have a plurality of vents H, respectively. Accordingly, a cooling device such as a fan (not shown) disposed in the server device 10 can cool the bus bar assembly 14 via the vents H.

In this embodiment, the bus bar assembly 14 further includes two first guiding plates 1495 and two second guiding plates 1496. The two first guiding plates 1495 are disposed on the vertical bus bar 144, and the first positive plate 1441, the first negative plate 1442 and the first insulation plate 1443 are partially disposed between the two first guiding plates 1495. The two second guiding plates 1496 are disposed on the transverse bus bar 145, and the second positive plate 1451, the second negative plate 1452 and the second insulation plate 1453 are partially disposed between the two second guiding plates 1496. The two first guiding plates 1495 facilitate the electrical connection between the power supply 12 and the vertical bus bar 144, and the two second guiding plates 1496 facilitate the electrical connection between the server 13 and the transverse bus bar 145. In addition, the two first guiding plates 1495 and the two second guiding plates 1496 are configured to protect the vertical bus bar 144 and the transverse bus bar 145. Moreover, since the two first guiding plates 1495 and the two second guiding plates 1496 are not electrodes, the two first guiding plates 1495 and the two second guiding plates 1496 may be grounded.

In this embodiment, the server 13 includes one positioning protrusion 132 merely, but the invention is not limited thereto. In other embodiments, the server may include a plurality of positioning protrusions.

Figure 7:
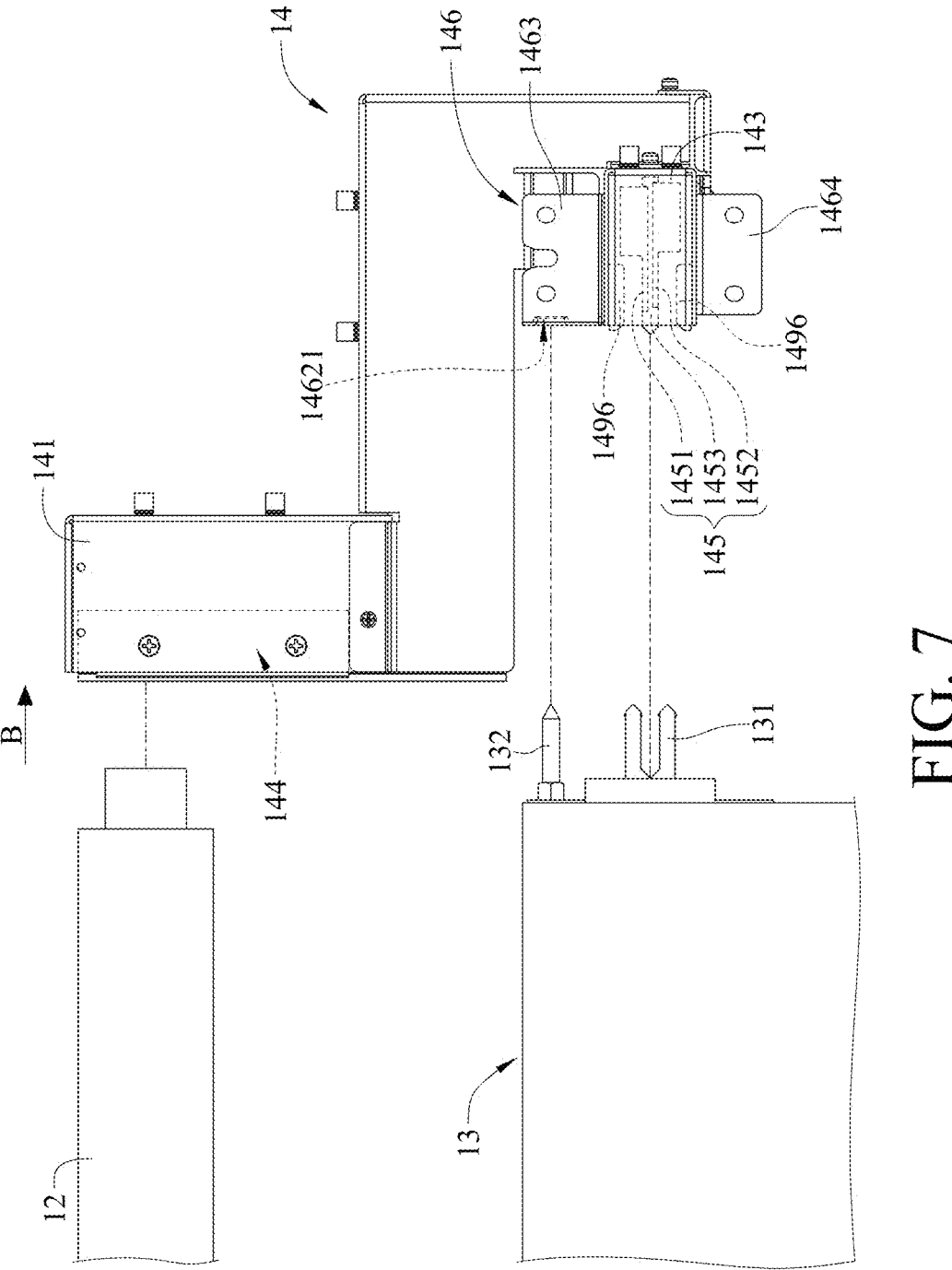
FIG. 7 is a plane view of an assembling process of a power supply, a server and the bus bar assembly of the server device in FIG. 1.

Please refer to FIG. 1 to FIG. 7, where FIG. 7 is a plane view of an assembling process of the power supply 12, the server 13 and the bus bar assembly 14 of the server device 10 in FIG. 1. During the assembly of the server device 10, the power supply 12, the server 13 and the bus bar assembly 14 are assembled along a direction B, such that the power supply 12 is electrically connected to the server 13 via the bus bar assembly 14. That is, the power supplied by the power supply 12 can be transferred to the server 13 via the bus bar assembly 14 having the vertical bus bar 144 and the transverse bus bar 145. Accordingly, the assembly of the server device 10 can be completed.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 8:
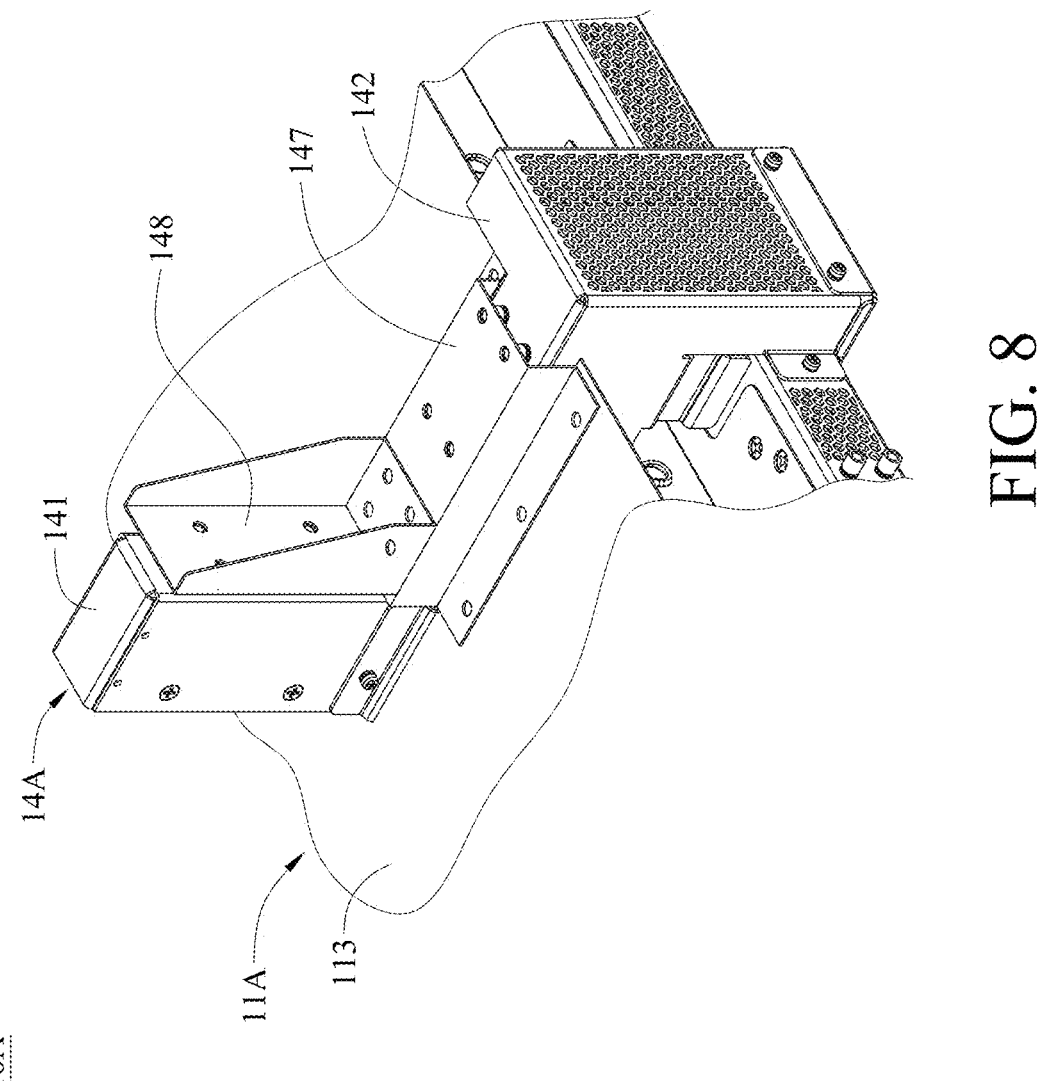
FIG. 8 is a perspective view of a server device in accordance with second embodiment of the invention.

Please refer to FIG. 8, which is a perspective view of a server device 10A in accordance with second embodiment of the invention. The server device 10A in this embodiment is similar to the server device 10 in FIG. 1. Therefore, the differences in this embodiment will be described below, and the similarities will not be repeated.

In this embodiment, the cabinet 11A of the server device 10A further include a shelf 113. The shelf 113 is disposed in the casing body 111 shown in FIG. 1 to FIG. 6. The bus bar assembly 14A further includes a fixing member 147 and a supporting member 148. The fixing member 147 fixes the connecting casing 142 to the shelf 113. The supporting member 148 is disposed on the first casing 141 and the fixing member 147, and supports the first casing 141. Accordingly, the bus bar assembly 14A can be disposed in the cabinet 11A more firmly via the fixing member 147 and the supporting member 148.

Figure 9:
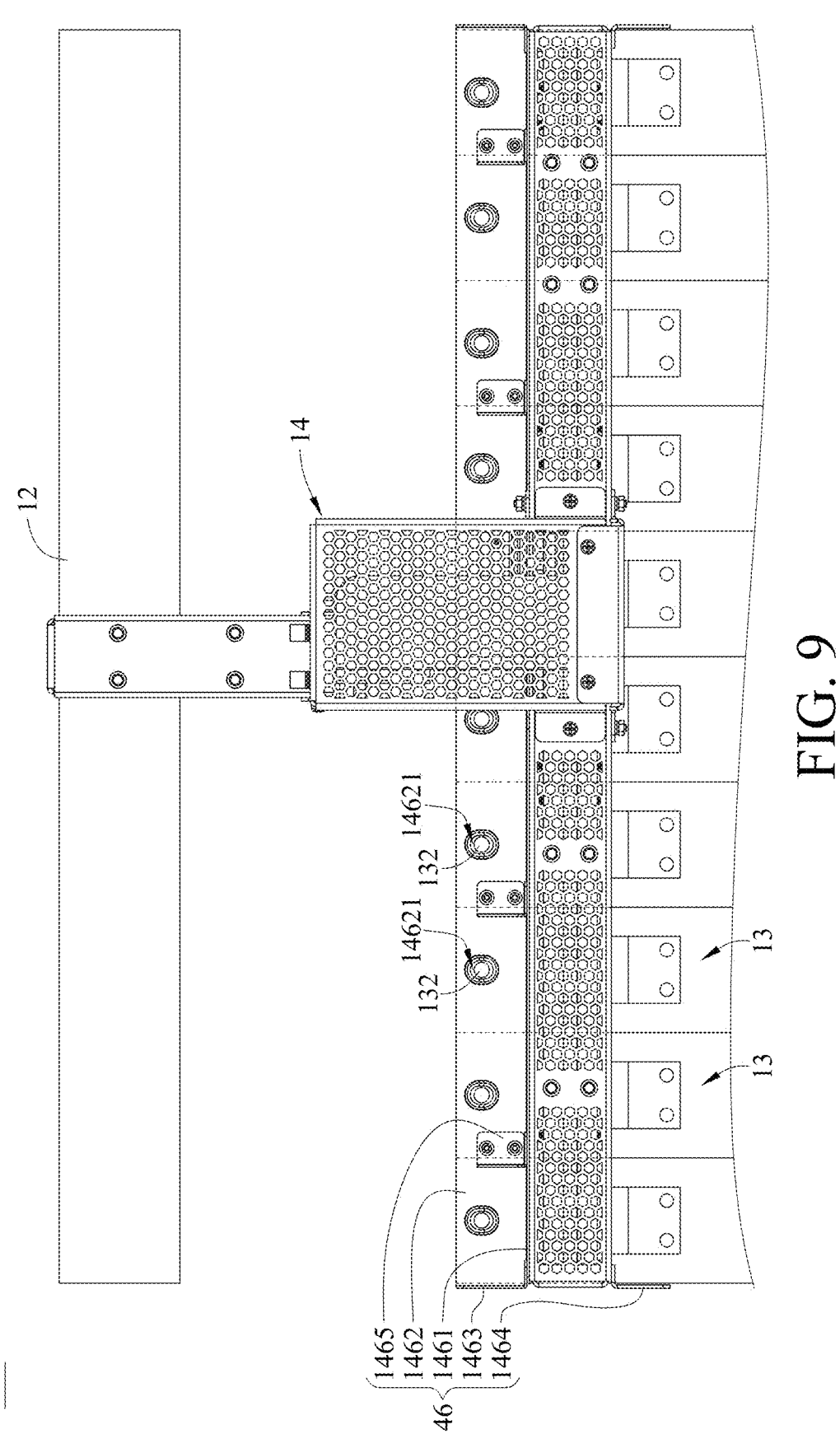
FIG. 9 is a plane view of a server device in accordance with third embodiment of the invention.
Figure 10:
FIG. 10 is an enlarged perspective view of the server device in FIG. 9.

In the above embodiments, the server device 10 and 10A include one server 13, respectively but the invention is not limited thereto. In other embodiments, please refer to FIG. 9 and FIG. 10, where FIG. 9 is a plane view of a server device 10B in accordance with third embodiment of the invention, and FIG. 10 is an enlarged perspective view of the server device 10B in FIG. 9. The server device 10B in this embodiment is similar to the server device 10 in FIG. 1. Therefore, the differences in this embodiment will be described below, and the similarities will not be repeated.

In this embodiment, the server device 10B includes a plurality of servers 13. The servers 13 and the positioning holes 14621 are arranged along an extending direction of the connecting plate 1462. That is, the servers 13 and the positioning holes 14621 are arranged transversely. The servers 13 are positioned to the bus bar assembly 14 via the positioning protrusions 132 inserted into the positioning holes 14621, respectively. In addition, the power supply 12 can supply power to the servers 13 via the bus bar assembly 14.

According to the bus bar assembly and the server device disclosed by the above embodiments, the first positive plate and the first negative plate of the vertical bus bar are perpendicular to the second positive plate and the second negative plate of the transverse bus bar, respectively. That is, since the bus bar assembly has the vertical bus bar and the transverse bus bar, a supplying direction of the power is allowed to be transferred from a vertical direction to a transverse direction. Thus, the bus bar assembly allows the power supply and the server perpendicular to each other to be electrically connected to each other without additional mounting components, thereby improving the convenience for configuring the components in the cabinet.

It will be apparent to those skilled in the art that various modifications and variations can be made to the invention. It is intended that the specification and examples be considered as exemplary embodiments only, with the scope of the invention being indicated by the following claims.

What is claimed is:

1. A bus bar assembly, configured to be mounted in a cabinet and electrically connecting a power supply and at least one server, the bus bar assembly comprising:

a vertical bus bar, comprising a first positive plate, a first negative plate and a first insulation plate, wherein at least a part of the first insulation plate is disposed between the first positive plate and the first negative plate, and the first positive plate and the first negative plate are configured to be electrically connected to the power supply;

a transverse bus bar, connected to the vertical bus bar and comprising a second positive plate, a second negative plate and a second insulation plate, wherein at least a part of the second insulation plate is disposed between the second positive plate and the second negative plate, and the second positive plate and the second negative plate are configured to be electrically connected to the at least one server;

two conductive connecting plates, wherein one of the two conductive connecting plates is electrically connected to the first positive plate and the second positive plate, and another one of the two conductive connecting plates is electrically connected to the first negative plate and the second negative plate;

a first casing, a connecting casing and a second casing, wherein the first casing accommodates the vertical bus bar, the second casing accommodates the transverse bus bar, the connecting casing connects the first casing and the second casing, and the connecting casing accommodates the two conductive connecting plates; and an assembling bracket, comprising a bottom plate, a connecting plate, at least one connecting member, two upper side plates and two lower side plates, the bottom plate is disposed on the second casing, the connecting plate is vertically connected to the bottom plate via the at least one connecting member, the two upper side plates are vertically connected to opposite sides of the bottom plate and the connecting plate, and the two lower side plates are vertically connected to a side of the bottom plate away from the two upper side plates;

wherein the first positive plate and the first negative plate are perpendicular to the second positive plate and the second negative plate, respectively.

2. The bus bar assembly according to claim 1, wherein the connecting plate comprises at least one positioning hole, the at least one positioning hole is configured for at least one positioning protrusion of the at least one server to be inserted and positioned therein.

3. The bus bar assembly according to claim 1, wherein at least one of the two upper side plates has a limiting recess, the limiting recess is configured for at least one limiting protrusion of the cabinet to be disposed therein to limit a movement of the bus bar assembly on the cabinet.

4. The bus bar assembly according to claim 1, wherein a side of the connecting casing away from the first casing and a side of the second casing away from the first casing have a plurality of vents, respectively.

5. A server device, comprising:
a cabinet;
a power supply, disposed in the cabinet;
at least one server, disposed in the cabinet; and
a bus bar assembly, disposed in the cabinet, wherein the bus bar assembly comprises:
a vertical bus bar, comprising a first positive plate, a first negative plate and a first insulation plate, wherein at least a part of the first insulation plate is disposed between the first positive plate and the first negative plate, and the first positive plate and the first negative plate are electrically connected to the power supply;

a transverse bus bar, connected to the vertical bus bar and comprising a second positive plate, a second negative plate and a second insulation plate, wherein at least a part of the second insulation plate is disposed between the second positive plate and the second negative plate, and the second positive plate and the second negative plate are electrically connected to the at least one server;

two conductive connecting plates, wherein one of the two conductive connecting plates is electrically connected to the first positive plate and the second positive plate, and another one of the two conductive connecting plates is electrically connected to the first negative plate and the second negative plate;

a first casing, a connecting casing and a second casing, wherein the first casing accommodates the vertical bus bar, the second casing accommodates the transverse bus bar, the connecting casing connects the first casing and the second casing, and the connecting casing accommodates the two conductive connecting plates; and an assembling bracket, comprising a bottom plate, a connecting plate, at least one connecting member, two upper side plates and two lower side plates, the bottom plate is disposed on the second casing, the connecting plate is vertically connected to the bottom plate via the at least one connecting member, the two upper side plates are vertically connected to opposite sides of the bottom plate and the connecting plate, the two lower side plates are vertically connected to a side of the second casing away from the two upper side plates, and the two upper side plates and the lower side plates are fixed to the cabinet;

wherein the first positive plate and the first negative plate are perpendicular to the second positive plate and the second negative plate, respectively.

6. The server device according to claim 5, wherein the at least one server comprises at least one positioning protrusion, the connecting plate comprises at least one positioning hole, the at least one positioning protrusion is inserted into the at least one positioning hole to position the bus bar assembly on the at least one server.

7. The server device according to claim 5, wherein a side of the connecting casing away from the first casing and a side of the second casing away from the first casing have a plurality of vents, respectively.

* * * * *